United States Patent [19]

Van Ooijen et al.

[11] Patent Number: 4,686,472

[45] Date of Patent: Aug. 11, 1987

[54] MAGNETIC SENSOR HAVING CLOSELY SPACED AND ELECTRICALLY PARALLEL MAGNETORESISTIVE LAYERS OF DIFFERENT WIDTHS

[75] Inventors: Johannes A. C. Van Ooijen, Asperen; Jacobus J. M. Ruigrok, Eindhoven, both of Netherlands

[73] Assignee: U.S. Philips Corporation, New York, N.Y.

[21] Appl. No.: 828,582

[22] Filed: Feb. 10, 1986

Related U.S. Application Data

[63] Continuation of Ser. No. 681,716, Dec. 13, 1984, abandoned, which is a continuation of Ser. No. 369,957, Apr. 19, 1982, abandoned.

[30] Foreign Application Priority Data

Apr. 22, 1981 [NL] Netherlands .......................... 8101962

[51] Int. Cl.[4] .................... G01R 33/02; H01L 43/08; G11C 19/08
[52] U.S. Cl. ................... 324/252; 338/32 R; 365/8; 365/158; 360/113
[58] Field of Search ...................... 324/252; 338/32 R; 365/8, 158; 360/113

[56] References Cited

U.S. PATENT DOCUMENTS

| | | | |
|---|---|---|---|
| 3,493,694 | 2/1970 | Hunt .................................... | 360/113 |
| 3,716,781 | 2/1973 | Almasi et al. ........................ | 324/252 |
| 3,860,965 | 1/1975 | Voegeli .............................. | 360/113 |
| 4,356,523 | 10/1982 | Yeh ..................................... | 360/113 |

Primary Examiner—Ernest F. Karlsen
Assistant Examiner—Walter E. Snow
Attorney, Agent, or Firm—F. Brice Faller

[57] ABSTRACT

A magnetic sensor for sensing magnetic fields including two flat layers of electrically conductive ferromagnetic material (11, 16) each having an in-plane easy axis of magnetization ($EA_1$, $EA_2$) and each producing a resistance variation under the influence of a magnetic field $H_a$ which originates from a source at an edge of the layer, which layers are situated a small distance apart parallel with respect to each other. In order to increase the sensor's sensitivity to small magnetic fields, in operation the layers (11, 16) convey currents flowing in the same direction and are connected in parallel to the input terminals of a detection circuit (2, 9).

18 Claims, 8 Drawing Figures

MAGNETIC SENSOR HAVING CLOSELY SPACED AND ELECTRICALLY PARALLEL MAGNETORESISTIVE LAYERS OF DIFFERENT WIDTHS

This is a continuation of application Ser. No. 681,716, filed 12-13-84 (now abandoned), which is a continuation of Ser. No. 369,957, filed 4-19-82 (now abandoned).

BACKGROUND OF THE INVENTION

The invention relates to a magnetic sensor which uses the magneto-resistance effect of two magneto-statically coupled flat layers of electrically conductive ferromagnetic material having an easy axis of magnetization in a major plane of the layer, which layers are situated a small distance apart parallel with respect to each other and give a response in the form of an electric resistance variation on application of a magnetic field having a component in the planes of the layers. A non-limitative enumeration of such materials, comprising in particular ferromagnetic nickel alloys, can be found in the article "The Anisotropy in The Magnetoresistance of Some Nickel Alloys" which is published in the periodical *Physica*, Vol. XXV, 1959, pages 702–720.

Sensors which are formed from a layer of these materials and use this property are essentially sensitive to the value of a magnetic flux, independent of whether said flux varies or not. They may be used in magnetic field meters, magnetic rulers and as magnetic reading heads for reading magnetic record carriers. In the latter case, they enable the reading of record carriers which are moved relative to the reading head at an arbitrary relative displacement velocity, zero velocity included. They have in addition a very extensive frequency response, from zero to a few tens of megahertz, as well as an amplitude of the reading signal which is considerably larger than that which can be obtained by inductive sensors which are sensitive only to variations of the magnetic flux.

However, ferromagnetic layers having a magneto-resistance effect suffer from the disadvantage of having a low sensitivity to small magnetic fields. U.S. Pat. No. 3,860,695 describes how this disadvantage can be mitigated by using a sensor having two flat magneto-resistive layers arranged parallel to each other, which layers are connected in series with a voltage source which has a constant voltage, while the voltages set up at their ends are supplied to a difference amplifier. The layers have equal electric and magnetic properties and thicknesses, an insulation layer of at least 30 nm being present between the layers and insulating the layers electrically from each other and producing a certain magnetostatic coupling between the layers, while the layers convey measuring currents flowing in opposite directions, the measuring current through each layer energizing the relevant layer and biasing magnetically the other layer by the magnetic field induced therein. Biasing is to be understood to mean herein that the direction of magnetization in a layer in the absence of an external magnetic field is biased so as to make an angle of approximately 45° with the direction of passage of the electric current, so that the operating point is moved towards the area having the largest inclination of the electric resistance-external field function. This means that, with a recording medium having a small magnetic signal an as large as possible resistance variation occurs. The direction of passage of the currents is always parallel to the largest dimension of each layer.

A disadvantage of this known configuration is that the measuring current must have a fixed value which is such that the magnetization directions induced in the layer indeed make an angle of approximately 45° with the current. Moreover, this involves, in practice, that the measuring current in each magnetic sensor has to be adjusted separately due to the spreading in properties of the layers.

A further disadvantage of this known configuration is that, because of the requirement that the two series-arranged magneto-resistive layers must be fully insulated from each other electrically, their separation must not be less than approximately 30 nm, because with thinner layers the possibility of undesired interconnections occurring is considerable. At this distance, the magnetostatic coupling between the layers is not optimum and a comparatively large measuring current is necessary to realize the rotation of the magnetization which is necessary for the desired biasing.

Another disadvantage is that two ends of the magneto-resistive layers of the known sensor have to be connected separately to a difference amplifier, which further complicates the manufacture of the magnetic reading head in thin film technology.

SUMMARY OF THE INVENTION

It is the object of the invention to provide a magnetic sensor or high sensitivity to small fields, which sensor combines a simple construction and a capability for using any desired measuring current, the measuring current used being moreover comparatively low.

Therefore, the sensor in accordance with the invention is characterized in that, during operation, the magneto-resistive layers convey currents flowing in the same direction and that they are connected in parallel to the input terminals of a detection circuit.

As a result of the electric parallel connection of the magneto-resistive layers, shortcircuits, if any, via the intermediate layer are of no significance, so that this intermediate layer may be made as thin as is necessary for an optimum magnetostatic coupling of the layers. The thickness will generally be smaller than 100 nm, and in particular smaller than 30 nm,—the thickness of the insulation layer of the known reading head. Thus, a considerably stronger magnetostatic coupling occurs between the layers. In particular, an electric conductor having a thickness smaller than 10 nm may now be used as an intermediate layer, so that only one of the layers need be connected to both a source of measuring current and to a reading circuit, which involves an extremely simple construction. As a result of the strong magnetostatic coupling so that the shape anisotropy is strongly reduced, the magnetizations of the layers are in all cases antiparallel. At a given low minimum value of the measuring current, the magnetization in the quiescent state of a layer must be perpendicular to the current when the easy axes of magnetization are parallel to the longitudinal axes, while for each value of the measuring current, however small, this may be the case when the easy axes of magnetization are perpendicular to the longitudinal axes.

All this means that, when a (small) external magnetic field is presented which is parallel to the direction of the magnetizations in the quiescent state in the layers, one of the magnetizations will rotate (the other one is already in the "correct" direction), whereas when a (small) magnetic field is presented which is perpendicular to the direction of the magnetizations in the quiescent state in the layers, both magnetizations will rotate to the "correct" direction. In both cases, it is found that when the parallel resistance of the layer configuration is measured the electric resistance-external magnetic field function has a very particular character.

As will be explained hereinafter this results in an extremely great sensitivity of the magnetic reading head according to the invention to small magnetic fields.

It is to be noted that a magnetoresistive reading head is known from U.S. Pat. No. 4,024,489 which consists of a stack of successively a magneto-resistive layer, a non-magnetic, electrically conductive layer of titanium and a magnetic bias layer provided on a substrate. The fixedly adjusted current through the magneto-resistive layer and the titanium layer generates a magnetic field in the bias layer which, in turn, via magnetostatic coupling, rotates the direction of magnetization of the magneto-resistive layer to such an extent as to enclose an angle of 45° with the current. In order to simplify the manufacturing process, the magnetic bias layer may be manufactured from the same material as the magneto-resistive layer but then the explicit requirement is imposed that it should be so much thinner than this one that, under the influence of the magnetic field induced therein, it is magnetically saturated and cannot operate as a magneto-resistance element. On the contrary, the operation of the magnetic reading head according to the invention is based on the fact that both magneto-statically coupled magneto-resistive layers operate as a magneto-resistance element.

Embodiments of the invention will now be described, by way of example, with reference to the accompanying drawing.

DESCRIPTION OF THE PREFERRED EMBODIMENTS

Figure 1:
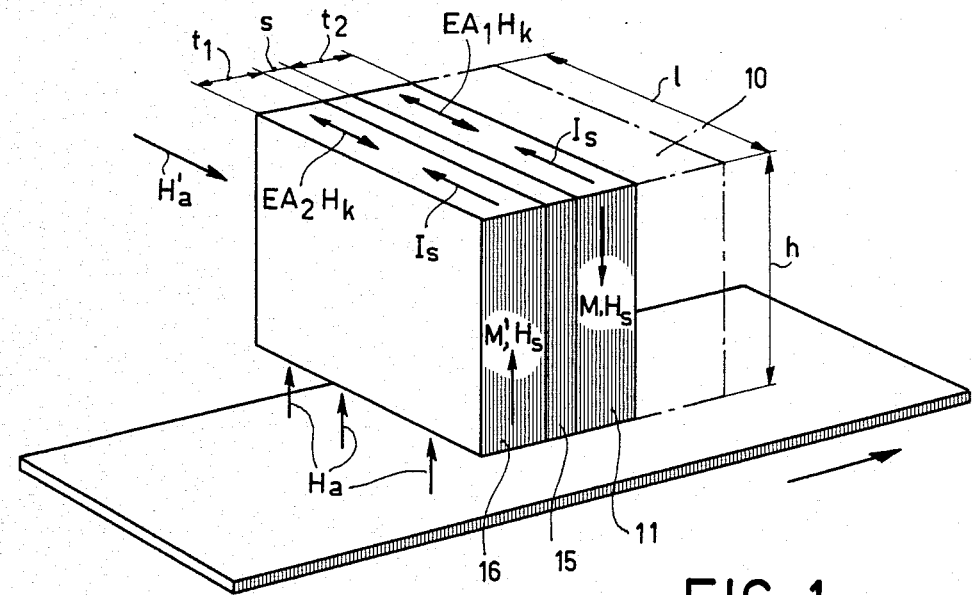
FIG. 1 shows diagrammatically a magnetic sensor according to the invention.

By way of simple illustration, FIG. 1 shows an embodiment of a construction of a magneto-resistive reading head according to the invention which is formed by successive depositions by sputtering in an inert atmosphere. By way of example, such a construction may have the following dimensions: length l equal to 600 μm, width h equal to 20 μm, thickness $t_1$ or $t_2$ of the order of 75 nm and intermediate space s, between the layers of the order of 1-30 nm.

First of all, a layer 11, for example of an iron-nickel alloy having 81% iron and 19% nickel, which alloy is known to show no magnetostriction effect, is deposited on a substrate 10 of, in this case, thermally oxidized silicon. During the deposition, a magnetic field having a field strength of approximately 16,000 A/m (200 Oe) is applied which induces an easy axis of magnetization EA1 in the layer 11. In the same sputter-run, a layer 15 (thickness for example 1 nm to 10 nm for producing a strong magnetostatic coupling between layer 11 and a second magneto-resistive layer 16 to be provided on top of the layer 15) is then deposited. Layer 16 is preferably of the same material as layer 11 and has approximately the same thickness and is provided in a magnetic orientation field which is such as to induce an easy axis of magnetization EA2 in the layer 16, which axis is parallel to the axis in the first layer. The layers 11 and 16 may have different thicknesses. This provides a parameter for adjusting the magnetization field. The magnetization states of the layers (in the absence of an external magnetic field), after applying a measuring current $I_s$, are denoted by M and M', respectively. Above the produced plane of the layer 16, connection conductors may then be deposited for the electric connection of the layer structure 11, 15, 16 to a reading circuit. A protective layer, for example of $SiO_2$, may then be deposited in a thickness which is of no importance for the operation of the magnetoresistive layers.

The connection conductors may be of Mo/Au/Mo, but they may also be formed from the same material as the magneto-resistive layers, in which case they are formed simultaneously with said layers, which reduces the number of depositions.

From the above it can be seen that a magnetic reading head according to the invention can be produced in a simple manner. When a layer 15 of non-magnetic, electrically insulating material is used, for example $SiO_2$, two windows should be provided therein for the electric interconnection of the layers 11 and 16, as a result of which the construction becomes a little more complicated.

Figure 2:
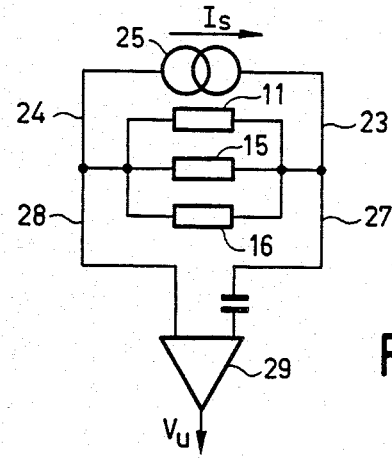
FIG. 2 shows diagrammatically an electric circuit diagram for the sensor of FIG. 1.

As shown in FIG. 2, the magnetostatically coupled layers 11 and 16 are connected to conductors 23 and 24, respectively, which are connected to a current source 25. 15 denotes a non-magnetic electrically conductive layer which ensures that no exchange coupling occurs between the layers 11 and 16. In the present case, molybdenum has been used as a material for the layer 15, but titanium and other non-magnetic electrically conductive layers may alternatively be used. The layers 11, 15 and 16 are connected in parallel, via conductors 27 and 28, to an amplifier 29 which provides an output signal $V_u$ which represents resistance variations of the layer structure 11, 15 and 16 as a whole.

Figure 3:
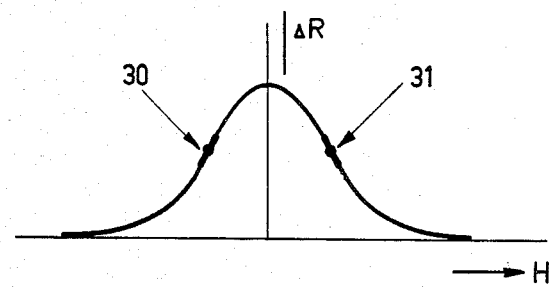
FIG. 3 shows a curve which gives the relationship between the resistor R and the magnetic field H in a known magnetic sensor.
Figure 4:
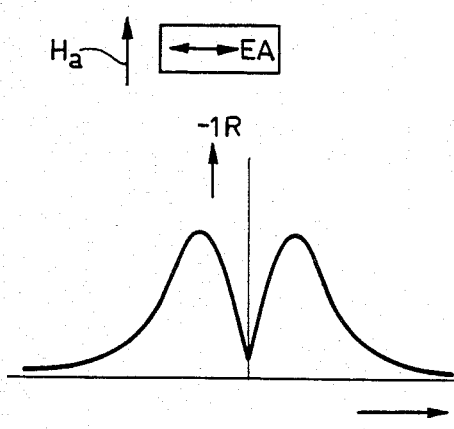
FIGS. 4 and 5 show curves giving the relationship between the resistor R and the magnetic field H in sensors according to the invention used in different manners.
Figure 5:
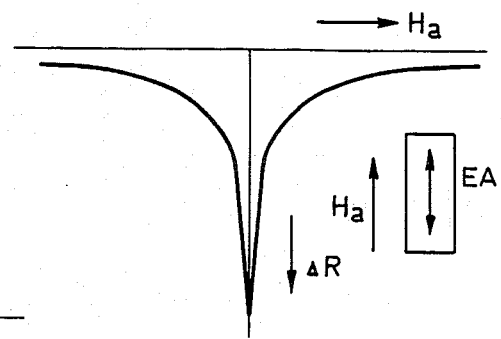

The resistance variations ΔR of a monolayer magneto-resistive element as a function of a magnetic field H is shown in FIG. 3. In the prior art magnetic reading head having the two magneto-statically coupled magneto-resistive elements connected to a difference amplifier, one element is biased at the operating point 30 of the characteristic in FIG. 3 and the other point is biased at operating point 31. As will be explained hereinafter, the magnetic sensor according to the invention has a quite different operation, which results in a significantly different and steeper characteristic, as is shown in FIGS. 4 and 5.

With a sufficiently large measuring current $I_s$, the directions of magnetization M and M' (see FIG. 1) will become anti-parallel in the transverse direction (demagnetization energy + energy in field $H_s$ produced by current $I_s$ is minimum) instead of anti-parallel in the longitudinal direction (demagnetization energy is minimum).

When $H_s$ is not too strong, the magnetization for a small applied field $H_a$ in the transverse direction, so anti-parallel to one of the directions of magnetization, in the relevant layer will rotate, in which the resistance increases for rotations up to 90° to decrease subsequently when $H_a$ increases further. For a field in the opposite direction, the same occurs with the other layer which, due to the electric parallel arrangement of the two layers, results in a transmission function which is equal for the two field directions (see FIG. 4).

A much stronger couple is exerted if the field is applied at 90° instead of 180° and 0° with the directions of magnetization, resulting in an even higher sensitivity. The resistance in both layers again increases without, however, again decreasing for even larger fields, since the magnetizations in their end position are parallel to $H_a$, so also parallel to the current through the layers (see FIG. 5). The high sensitivity is demonstrated by the increased steepness of the curve of FIG. 5 compared with that of FIG. 4. The steepness of the two curves moreover is considerably larger than the steepness in the operating points 30, 31 of the FIG. 3 curve.

Figure 6:
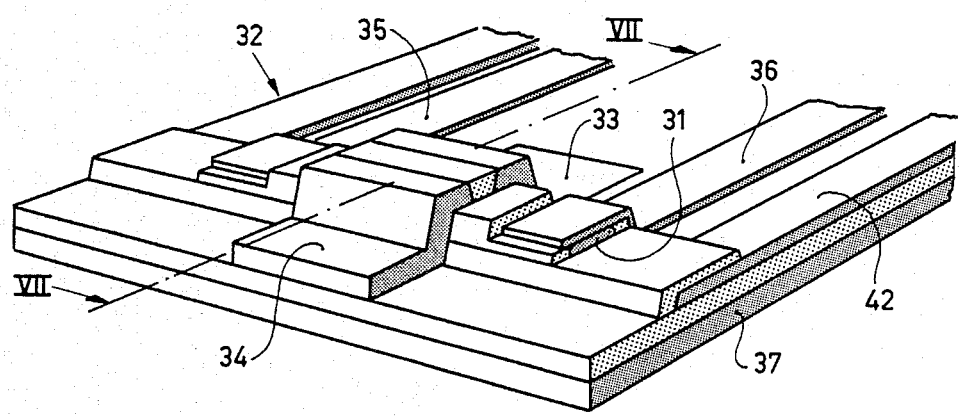
FIG. 6 shows an embodiment of a magnetic sensor according to the invention.

FIG. 6 shows the use of a magneto-resistive layer structure 31 having two magneto-resistive layers and a non-magnetic electrically conductive intermediate layer of the type shown in FIG. 1 in a magnetic reading head 32 having so-called flux conductors 33 and 34. The layer structure 31 comprises connection conductors 35 and 36 and is provided on a substrate 37 of (nickel-zinc) ferrite together with the flux conductors 33 and 34 in such manner that magnetic flux is returned from a recording medium 38 (FIG. 7) via flux conductor 34, layer structure 31, flux conductor 33 and ferrite substrate 37 to the recording medium 38.

Figure 8:
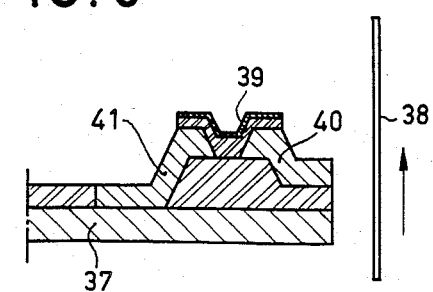
FIG. 8 is a cross-sectional view corresponding to the cross-sectional view of FIG. 7 through an alternative embodiment of a sensor according to the invention.

FIG. 8 is a sectional view of an alternative construction in which magnetoresistive layer structure 39 is not present within flux conductors 40 and 41, but beyond them.

Figure 7:
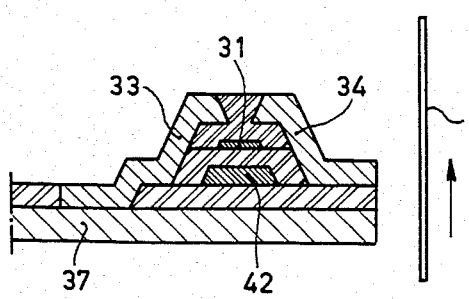
FIG. 7 is a cross-sectional view through the sensor of FIG. 6.

FIGS. 6 and 7 show in addition an extra electric conductor 42 which is not necessary for the operation of the magnetic sensor but may advantageously be used in certain applications, for example, as a "bias" conductor for inducing a magnetic bias field in the layer structure 31, or as a feedback conductor for inducing a magnetic feedback field in the layer structure 31. In itself, however, the advantage of the sensor according to the invention is that the sensitivity to small fields is improved as it will become apparent from a comparison of the characteristics of FIG. 4 and FIG. 5 with that of FIG. 3. This involves, for example, that even with small "digital" magnetic fields a strong digital pulse is given with each direction variation of the field to be measured. This makes the sensor according to the invention, for example, also very suitable for use in detecting magnetic bubbles.

What is claimed is:

1. In a magnetic sensor assembly for detecting signals recorded on an associated magnetic medium, the sensor comprising:
    two magnetostatically coupled magnetoresistive elements, each element having a respective planar surface, the respective planar surfaces being mutually parallel and being mutually separated by a distance, each element also having an easy axis of magnetization oriented substantially parallel with the respective planar surface;
    the recorded signals provided a magnetic signal field applied to the magnetoresistive elements in a signal direction; and
    means for providing, in operation of the sensor, measuring currents which simultaneously flow in a current direction through the elements so that each measuring current flowing through an element serves to provide the sole magnetic bias for the other of the elements, the magnetizations of the elements being biased in opposite directions;
    wherein, in operation of the sensor, the magnetizations of the elements are oriented perpendicularly to the current direction and parallel with the signal direction, each of the magnetoresistive elements having a respective thickness measured in a direction perpendicular to the respective planar surface, the thicknesses of the magnetoresistive elements being different.

2. An assembly as claimed in claim 1, characterized in that the easy access of each element is parallel to the current direction.

3. An assembly as claimed in claim 1, characterized in that the distance separating the planar surfaces is less than 30 nanometers.

4. An assembly as claimed in claim 1, characterized in that the assembly further comprises means, connected to the elements, for sensing a voltage across a parallel resistance of the elements.

5. A sensor assembly as in claim 1 wherein the elements are connected electrically in parallel.

6. An assembly as claimed in claim 1, characterized in that the assembly further comprises an intermediate layer arranged between the planar surfaces of the elements so that the elements are separated by and in contact with the intermediate layer, the intermediate layer being as of a non-magnetic, electrically-conductive material.

7. An assembly as claimed in claim 6, characterized in that the intermediate layer has a thickness of less than 10 nanometers.

8. An assembly as claimed in claim 6, characterized in that the intermediate layer consists essentially of molybdenum.

9. An assembly as claimed in claim 6, characterized in that the intermediate layer consists essentially of titanium.

10. In a magnetic sensor assembly for detecting signals recorded on an associated magnetic medium, the sensor comprising:
    two magnetostatically coupled magnetoresistive elements, each element having a respective planar surface, the respective planar surfaces being mutually parallel and being mutually separated by a distance, each element also having an easy axis of magnetization oriented substantially parallel with the respective planar surface;
    the recorded signals providing a magnetic signal field applied to the magnetoresistive elements in a signal direction; and
    means for providing, in operation of the sensor, measuring currents which simultaneously flow in a current direction through the elements so that each measuring current flowing through an element serves to provide a sole magnetic bias for the other of the elements, the magnetizations of the elements being biased in opposite directions;

wherein, in operation of the sensor, the magnetizations of the elements are oriented perpendicularly to both the current and signal directions, each of the magnetoresistive elements having a respective thickness measured in a direction perpendicular to the respective planar surface, the thickness of the magnetoresistive elements being different.

11. An assembly as claimed in claim 10, characterized in that the easy access of each element is parallel to the current direction.

12. An assembly as claimed in claim 10, characterized in that the distance separating the planar surfaces is less than 30 nanometers.

13. An assembly as claimed in claim 10, characterized in that the assembly further comprises means, connected to the elements, for sensing a voltage across a parallel resistance of the elements.

14. A sensor assembly as in claim 10 wherein the elements are connected electrically in parallel.

15. An assembly as claimed in claim 10, characterized in that the assembly further comprises an intermediate layer arranged between the planar surfaces of the elements so that the elements are separated by and in contact with the intermediate layer, the intermediate layer being of of a non-magnetic, electrically-conductive material.

16. An assembly as claimed in claim 15, characterized in that the intermediate layer has a thickness of less than 10 nanometers.

17. An assembly as claimed in claim 15, characterized in that the intermediate layer consists essentially of molybdenum.

18. An assembly as claimed in claim 15, characterized in that the intermediate layer consists essentially of titanium.

* * * * *